US010941324B2

(12) United States Patent
Hirakawa et al.

(10) Patent No.: US 10,941,324 B2
(45) Date of Patent: Mar. 9, 2021

(54) ADHESIVE COMPOSITION, AND COVERLAY FILM, FLEXIBLE COPPER CLAD LAMINATE, AND ADHESIVE SHEET USING ADHESIVE COMPOSITION

(71) Applicant: TOAGOSEI CO., LTD., Tokyo (JP)

(72) Inventors: Makoto Hirakawa, Aichi (JP); Masashi Yamada, Aichi (JP); Anna Sekioka, Tokyo (JP)

(73) Assignee: TOAGOSEI CO., LTD., Tokyo (JP)

( * ) Notice: Subject to any disclaimer, the term of this patent is extended or adjusted under 35 U.S.C. 154(b) by 26 days.

(21) Appl. No.: 16/314,713

(22) PCT Filed: Jul. 3, 2017

(86) PCT No.: PCT/JP2017/024329
§ 371 (c)(1),
(2) Date: Jan. 2, 2019

(87) PCT Pub. No.: WO2018/008592
PCT Pub. Date: Jan. 11, 2018

(65) Prior Publication Data
US 2019/0256750 A1 Aug. 22, 2019

(30) Foreign Application Priority Data
Jul. 4, 2016 (JP) .............................. JP2016-132317

(51) Int. Cl.
C09J 177/00 (2006.01)
B32B 15/08 (2006.01)
B32B 15/20 (2006.01)
C09J 11/06 (2006.01)
C09J 163/00 (2006.01)
B32B 27/20 (2006.01)
H05K 1/03 (2006.01)
B32B 27/00 (2006.01)
C09J 177/06 (2006.01)
H05K 3/28 (2006.01)
C09J 177/08 (2006.01)
B32B 27/38 (2006.01)
B32B 27/34 (2006.01)
C09J 11/04 (2006.01)
C08K 5/544 (2006.01)

(52) U.S. Cl.
CPC ............. *C09J 177/00* (2013.01); *B32B 15/08* (2013.01); *B32B 15/20* (2013.01); *B32B 27/00* (2013.01); *B32B 27/20* (2013.01); *B32B 27/34* (2013.01); *B32B 27/38* (2013.01); *C09J 11/04* (2013.01); *C09J 11/06* (2013.01); *C09J 163/00* (2013.01); *C09J 177/06* (2013.01); *C09J 177/08* (2013.01); *H05K 1/03* (2013.01); *H05K 3/28* (2013.01); *B32B 2311/12* (2013.01); *B32B 2379/08* (2013.01); *C08K 5/5442* (2013.01); *C09J 2467/005* (2013.01); *C09J 2479/086* (2013.01)

(58) Field of Classification Search
CPC ...... C09J 177/00; C09J 163/00; C09J 177/06; C09J 177/08; C08K 5/5442
See application file for complete search history.

(56) References Cited

U.S. PATENT DOCUMENTS 5,523,137 A * 6/1996 Sei ............................ C09J 7/21
428/41.7
8,344,262 B2 * 1/2013 Tamiya ..................... B32B 5/26
174/258

FOREIGN PATENT DOCUMENTS

| JP | 2000-188451 A | 7/2000 |
| JP | 2002348392 A * | 12/2002 |
| JP | 2006-176764 A | 7/2006 |
| JP | 2006-232984 A | 9/2006 |
| JP | 2006297928 A * | 11/2006 |
| JP | 2009-256626 A | 11/2009 |
| JP | 2013-147522 A | 8/2013 |
| JP | 2013-227441 A | 11/2013 |
| JP | 2015-221864 A | 12/2015 |
| WO | WO-9634040 A1 * | 10/1996 ............ C09J 163/00 |

OTHER PUBLICATIONS

English-language machine translation of JP-2002348392, performed on Espacenet on May 7, 2020.*
English-language machine translation of JP-2006176764, performed on Espacenet on May 7, 2020.*
English-language machine translation of JP-2006297928, performed on Espacenet on May 7, 2020.*
Ha Q. Pham & Maurice J. Marks, "Epoxy Resins," in 13 Ullmann's Encyclopedia of Industrial Chemistry 155, published online 2005.*
SciFinder Scholar entry information for CAS Registry No. 149394-70-7, downloaded from SciFinder on May 8, 2020.*
SciFinder Scholar entry information for CAS Registry No. 301543-04-4, downloaded from SciFinder on Sep. 2, 2020.*

(Continued)

Primary Examiner — Nicholas E Hill
(74) Attorney, Agent, or Firm — Fitch, Even, Tabin & Flannery, LLP

(57) ABSTRACT

An adhesive composition is provided which exhibits not only adhesiveness to a polyimide film or copper foil, but also high adhesiveness to gold-plated copper foil, and is also superior in heat resistance such as soldering heat resistance.

The adhesive composition comprises a solvent-soluble polyamide resin (A) which is solid at 25° C., an epoxy resin (B), and an imidazole compound (C) having an alkoxysilyl group, wherein the mass ratio (A)/(B) of the component (A) to the component (B) is 99/1-50/50, and the content of the component (C) is 0.3-5 parts by mass with respect to 100 parts by mass of the total of the component (A) and the component (B).

13 Claims, No Drawings

(56) References Cited

OTHER PUBLICATIONS

International Search Report for PCT/JP2017/024329, dated Aug. 1, 2017, and English Translation submitted herewith (5 pages).
Office Action issued against corresponding Chinese Patent Application No. 201780039681.4 dated Nov. 27, 2020, English translation not available (10 pages).
Deng Haibo et al., pp. 39-40, Copper Clad Laminate Information, No. 2, 2008, Apr. 25, 2008.
Deng Shunyang, pp. 145-146, China Petrochemical Press, 1st Edition, Oct. 2001.

* cited by examiner

ADHESIVE COMPOSITION, AND COVERLAY FILM, FLEXIBLE COPPER CLAD LAMINATE, AND ADHESIVE SHEET USING ADHESIVE COMPOSITION

CROSS-REFERENCE TO RELATED APPLICATIONS

This application is a U.S. national phase application filed under 35 U.S.C. § 371 of International Application No. PCT/JP2017/024329, filed Jul. 3, 2017, designating the United States, which claims priority from Japanese Patent Application No. 2016-132317, filed Jul. 4, 2016, and the complete disclosures of all the applications are hereby incorporated herein by reference in their entirety.

TECHNICAL FIELD

The present invention relates to an adhesive composition excellent in adhesiveness and heat resistance such as soldering heat resistance and suitable for bonding electronic components.

BACKGROUND ART

In recent years, with miniaturization, densification and other diversification of electronic equipment, demand for flexible printed wiring board-related products has increased. The flexible printed wiring board-related products include, for example, a flexible copper clad laminate in which a polyimide film and copper foil are bonded to each other, a flexible printed wiring board in which a circuit is formed on a flexible copper clad laminate, a reinforcing plate-attached flexible printed wiring board in which a flexible printed wiring board and a reinforcing plate are bonded to each other, and a multilayer board in which flexible copper clad laminates or flexible printed wiring boards are stacked and laminated. In order to bond the polyimide film to the copper foil in these products, an adhesive is appropriately used.

Further, such an adhesive is often required to have not only the conventional adhesion function but also another function such as heat dissipation and electrical conductivity, and in order to meet the above requirement, the adhesive is often mixed with a large amount of inorganic fillers when used.

The adhesives used in the aforementioned flexible printed wiring board-related products are exemplified as follows. Patent Literature 1 discloses an adhesive composition comprising a blend of a nylon resin, a novolac type epoxy resin, and a brominated epoxy resin. Patent Literature 2 discloses an adhesive composition comprising a phenoxy resin, an epoxy resin, a carboxyl group-containing acrylonitrile-butadiene rubber, a curing agent, and the like.

CITATION LIST

Patent Literature

Patent Literature 1: Japanese Patent Laid-Open (Kokai) No. 2000-188451
Patent Literature 2: Japanese Patent Laid-Open (Kokai) No. 2006-232984
Patent Literature 3: Japanese Patent Laid-Open (Kokai) No. 2013-227441

SUMMARY OF INVENTION

Technical Problem

The aforementioned flexible printed wiring board normally has a copper foil portion which is gold-plated in order to make electrical connection, but the adhesives described in Patent Literatures 1 and 2 were insufficient in adhesiveness to that portion, and were unable to meet the requirements for heat resistance such as soldering heat resistance. In order to solve this, the present inventors invented an adhesive composition comprising a blend of a polyamide resin, an epoxy resin, and an imidazole compound having a particular triazine skeleton (Patent Literature 3). However, the adhesive described in Patent Literature 3 did not sufficiently solve the problem of blistering during the reflow step of gold plating when it was used with addition of a large amount of inorganic filler.

It is an object of the present invention to provide an adhesive composition that exhibits not only adhesiveness to a polyimide film and copper foil but also high adhesiveness to gold-plated copper foil and is also excellent in heat resistance such as soldering heat resistance and prevention of occurrence of blistering during soldering (hereinafter referred to as "reflow resistance"). Further, it is an object of the present invention to provide an adhesive composition that can maintain the above properties even when a large amount of an inorganic filler is added, and thus can also be used as an adhesive having a function such as heat dissipation and electrical conductivity.

Solution to Problem

The present inventors have studied diligently in view of the above objects, and as a result have found that an adhesive composition comprising predetermined amounts of a specific polyamide resin, an epoxy resin, and an imidazole compound having an alkoxysilyl group has good adhesiveness to gold-plated copper foil, is excellent in durability such as soldering heat resistance, and can prevent the occurrence of blistering during soldering, thereby leading to the completion of the present invention.

Thus, according to one aspect, the present invention provides an adhesive composition comprising a solvent-soluble polyamide resin (A) that is solid at 25° C., an epoxy resin (B), and an imidazole compound (C) having an alkoxysilyl group, which has a mass ratio (A)/(B) of the component (A) to the component (B) of 99/1 to 50/50, and contains the component (C) in an amount of 0.3 to 5 parts by mass with respect to 100 parts by mass of the total of the component (A) and the component (B).

According to a preferred embodiment of the above adhesive composition of the present invention, the imidazole compound (C) having an alkoxysilyl group is a compound represented by the following general formula (1) or an acid adduct thereof.

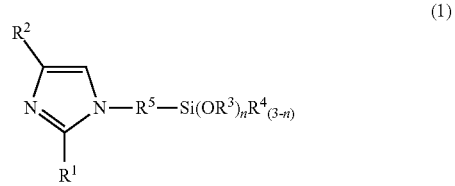

(1)

wherein $R^1$ and $R^2$ are each independently one selected from a group consisting of a hydrogen atom, a saturated hydrocarbon group, an unsaturated hydrocarbon group, and an aryl group, and these groups may have a substituent; $R^3$ and $R^4$ are each independently a hydrogen atom or an alkyl group, at least one of $R^3$ is an alkyl group, and the alkyl group may have a substituent; n is 1 to 3; and $R^5$ represents an alkylene chain or an alkylene chain partially substituted by a formula (2) to (5).

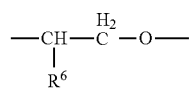
(2)

wherein $R^6$ represents a hydrogen atom or a hydroxyl group,

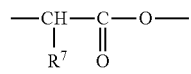
(3)

wherein $R^7$ represents a hydrogen atom, an alkyl group, or an aryl group,

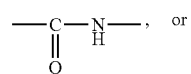
(4)

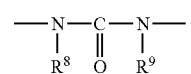
(5)

wherein $R^8$ and $R^9$ are each independently one selected from a group consisting of a hydrogen atom, an alkyl group, and an aryl group, and these groups may have a substituent.

According to another preferred embodiment of the above adhesive composition of the present invention, the imidazole compound (C) having an alkoxysilyl group is a compound represented by the following general formula (6) or (7) or an acid adduct thereof.

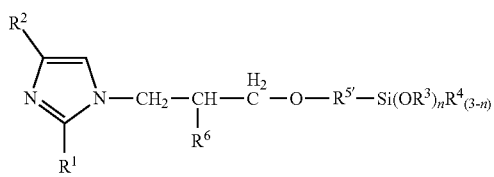
(6)

wherein $R^1$, $R^2$, $R^3$, $R^4$, and n are the same as in the formula (1), $R^7$ is the same as in the formula (2), and $R^{5'}$ is an alkylene chain.

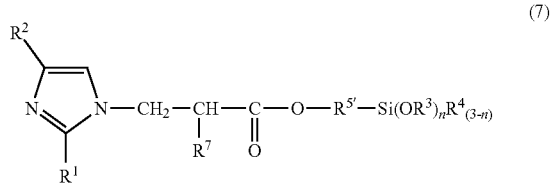
(7)

wherein $R^1$, $R^2$, $R^3$, $R^4$, and n are the same as in the formula (1), $R^7$ is the same as in the formula (3), and $R^{5'}$ is an alkylene chain.

According to another preferred embodiment of the above adhesive composition of the present invention, the epoxy resin (B) is an epoxy resin having three or more epoxy groups in one molecule.

According to another preferred embodiment of the above adhesive composition of the present invention, the epoxy resin (B) is a bisphenol A novolac type epoxy resin.

According to another preferred embodiment of the above adhesive composition of the present invention, the adhesive composition further comprises an inorganic filler (D) in an amount of 10 to 250 parts by mass with respect to 100 parts by mass of the total of the polyamide resin (A) and the epoxy resin (B).

According to another aspect, the present invention provides a coverlay film which comprises a polyimide film and a layer of the aforementioned adhesive composition that is formed on one surface of the polyimide film.

According to still another aspect, the present invention provides a flexible copper clad laminate which comprises a polyimide film and copper foil, wherein the aforementioned adhesive composition is laminated between at least one surface of the polyimide film and the copper foil.

According to still another aspect, the present invention provides an adhesive sheet which comprises a releasable film and a layer of the aforementioned adhesive composition that is formed on a surface of the releasable film.

Advantageous Effects of Invention

The adhesive composition of the present invention contains predetermined amounts of a specific polyamide resin, an epoxy resin, and an imidazole compound having an alkoxysilyl group, as described above. Therefore, the adhesive composition of the present invention exhibits high adhesiveness to gold-plated copper foil used in flexible printed wiring board-related products and the like. When the adhesive composition further contains an inorganic filler, it also has an effect of being also excellent in heat resistance, and is therefore improved in adhesion reliability.

DESCRIPTION OF EMBODIMENTS

An embodiment of the present invention will be described as follows, but the present invention is not limited to this.
<1. Adhesive Composition>

The adhesive composition of the present invention is a composition containing predetermined amounts of a solvent-soluble polyamide resin (A) that is solid at 25° C., an epoxy resin (B), and an imidazole compound (C) having an alkoxysilyl group. The adhesive composition of the present invention may be a composition further containing an inorganic filler (D). The components of the adhesive composition of the present invention will be specifically described below.

(A) Solvent-Soluble Polyamide Resin that is Solid at 25° C.

The solvent-soluble polyamide resin that is solid at 25° C. is one of the main components in the adhesive composition of the present invention and is a component that is responsible for functions such as adhesiveness and flexibility of the adhesive. Examples of the polyamide resin include copolymerized polyamide resins obtained by copolymerizing a dibasic acid and a diamine, and polyamide resins in which a N-alkoxymethyl group is introduced into a polyamide bond in the molecule thereof. The polyamide resin only has to be soluble in a solvent, and the type of solvent is not particularly limited.

The above copolymerized polyamide resins are obtained by use of two or more dibasic acids and two or more diamines as monomers. Specific examples of the above dibasic acid include adipic acid, sebacic acid, azelaic acid, undecanedioic acid, dodecanedioic acid, dimer acid, isophthalic acid, terephthalic acid, and sodium 5-sulfoisophthalate. Specific examples of the diamine include hexamethylenediamine, heptamethylenediamine, p-diaminomethylcyclohexane, bis(p-aminocyclohexyl)methane, m-xylenediamine, piperazine, and isophoronediamine.

Among the above copolymerized polyamide resins, particularly preferred are copolymerized polyamide resins obtained by copolymerizing an aliphatic dibasic acid and an alicyclic diamine since they are excellent in solvent-solubility, cause little increase in viscosity even if stored for a long time, and further have high affinity for the imidazole compound (C) having an alkoxysilyl group described later, thereby providing excellent adhesiveness to gold-plated copper foil and reflow resistance.

In the production of the above copolymerized polyamide resin, an aminocarboxylic acid, a lactam, or the like may be appropriately blended during preparation. Specific examples thereof include 11-aminoundecanoic acid, 12-aminododecanoic acid, 4-aminomethylbenzoic acid, 4-aminomethylcyclohexanecarboxylic acid, ε-caprolactam, ω-laurolactam, α-pyrrolidone, and α-piperidone.

In the production of the above copolymerized polyamide resin, a polyalkylene glycol may be appropriately blended for the purpose of providing flexibility. Specific examples of the polyalkylene glycol include polyethylene glycol, polypropylene glycol, polytetramethylene glycol, block or random copolymers of ethylene oxide and propylene oxide, block or random copolymers of ethylene oxide and tetrahydrofuran, and mixtures thereof.

The copolymerized polyamide resin obtained in this manner has the configuration of, for example, 6/66, 6/6-10, 6/66/6-10, 6/66/11, 6/66/12, 6/6-10/6-11, 6/11/isophoronediamine, 6/66/6, or 6/6-10/12.

The above-described "polyamide resins in which a N-alkoxymethyl group is introduced into a polyamide bond in the molecule thereof" are alcohol-soluble nylon resins formed by addition of formaldehyde and an alcohol to a polyamide bond so as to introduce an N-alkoxymethyl group. Specific examples include those obtained by alkoxymethylating 6-nylon, 66-nylon, or the like. The introduction of the above N-alkoxymethyl group contributes to a decrease in the melting point, an increase in flexibility, and an improvement in solubility, and the introduction rate is appropriately set according to the purpose.

The polyamide resin used in the adhesive composition of the present invention is solid at 25° C. In a case where the polyamide resin is liquid at 25° C., when the polyamide resin is blended with the epoxy resin, the reaction is too fast, and gelation and precipitation in the solution, or significant thickening may occur.

In case of the adhesive composition of the present invention, excellent adhesiveness and heat resistance can be obtained by the reaction of the amino group of the polyamide resin with the epoxy group of the epoxy resin. Generally, when the amine value of the polyamide resin is high, the reaction of the amino group with the epoxy group is fast, and good curability is obtained by heat treatment in a short time. On the other hand, the reaction proceeds even at ordinary temperature, and therefore the reaction proceeds gradually immediately after mixing, and the liquid viscosity increases significantly, or gelation occurs. Therefore, the amine value is preferably set at a suitable value that can achieve both curability and stability, and specifically in the range of 1 to 6 mg KOH/g.

When the melting point of the above polyamide resin is too low, the cured product of the adhesive becomes poor in heat resistance. Conversely, when the melting point of the above polyamide resin is too high, solvent-solubility is deteriorated. Therefore, the melting point in the range of 50 to 220° C. can satisfy both the solubility of the adhesive composition and the heat resistance of the cured product of the adhesive, which is preferred. The melting point is more preferably in the range of 70 to 180° C. The measurement of the above melting point is performed by a microscopic method.

Specific examples of the solvent that dissolves the above polyamide resin include organic solvents including alcohol solvents such as methanol, ethanol, i-propyl alcohol, n-propyl alcohol, i-butyl alcohol, n-butyl alcohol, benzyl alcohol, ethylene glycol monomethyl ether, propylene glycol monomethyl ether, diethylene glycol monomethyl ether, and diacetone alcohol; ketone solvents such as acetone, methyl ethyl ketone, methyl isobutyl ketone, methyl amyl ketone, cyclohexanone, and isophorone; aromatic solvents such as toluene, xylene, ethylbenzene, and mesitylene; ester solvents such as methyl acetate, ethyl acetate, ethylene glycol monomethyl ether acetate, and 3-methoxybutyl acetate; and chlorinated solvents such as chloroform, carbon tetrachloride, dichloromethane, and trichloroethylene. These are used singly or in combination of two or more thereof.

(B) Epoxy Resin

The epoxy resin (B) is a component that is responsible for functions such as adhesiveness and heat resistance in the adhesive composition of the present invention. Examples of the epoxy resin include bisphenol A type epoxy resins, bisphenol F type epoxy resins, and hydrogenated products thereof; glycidyl ester type epoxy resins such as orthophthalic acid diglycidyl ester, isophthalic acid diglycidyl ester, terephthalic acid diglycidyl ester, p-hydroxybenzoic acid glycidyl ester, tetrahydrophthalic acid diglycidyl ester, succinic acid diglycidyl ester, adipic acid diglycidyl ester, sebacic acid diglycidyl ester, and trimellitic acid triglycidyl ester; glycidyl ether type epoxy resins such as ethylene glycol diglycidyl ether, propylene glycol diglycidyl ether, 1,4-butanediol diglycidyl ether, 1,6-hexanediol diglycidyl ether, trimethylolpropane triglycidyl ether, pentaerythritol tetraglycidyl ether, tetraphenyl glycidyl ether ethane, triphenyl glycidyl ether ethane, polyglycidyl ether of sorbitol, and polyglycidyl ether of polyglycerol; glycidyl amine type epoxy resins such as triglycidyl isocyanurate and tetraglycidyl diaminodiphenylmethane; linear aliphatic epoxy resins such as epoxidized polybutadiene and epoxidized soybean oil; and novolac type epoxy resins such as phenol novolac type epoxy resins, o-cresol novolac type epoxy resins, and bisphenol A novolac type epoxy resins.

Further, as examples of the epoxy resins, can be used those provided with flame retardancy, including brominated bisphenol A type epoxy resins, phosphorus-containing epoxy resins, dicyclopentadiene structure-containing epoxy resins, naphthalene structure-containing epoxy resins, anthracene type epoxy resins, tertiary butyl catechol type epoxy resins, triphenylmethane type epoxy resins, tetraphenylethane type epoxy resins, biphenyl type epoxy resins, and bisphenol S type epoxy resins.

In the adhesive composition of the present invention, among the above epoxy resins, novolac type epoxy resins, especially bisphenol A novolac type epoxy resins have a large effect of improving reflow resistance. Therefore, in the present invention, a bisphenol A novolac type epoxy resin is preferably used singly or in combination with another epoxy resin.

In the adhesive composition of the present invention, an epoxy resin having three or more epoxy groups in one molecule is preferred since it can form a crosslinked structure in the cured product of the adhesive to exhibit high heat resistance. Epoxy resins having two or less epoxy groups in one molecule are low in degree of crosslinking of the cured product, and therefore sufficient soldering heat resistance may not be obtained.

The mass ratio (A)/(B) of the solvent-soluble polyamide resin (A) that is solid at 25° C. to the epoxy resin (B) in the adhesive composition of the present invention is 99/1 to 50/50, more preferably 99/1 to 55/45, and further preferably 95/5 to 60/40. When the mass ratio of the epoxy resin (B) is less than 1 relative to 100 of the total of the above solvent-soluble polyamide resin (A) and the epoxy resin (B), elastic modulus of the cured product of the adhesive decreases, and therefore sufficient heat resistance may not be obtained. On the other hand, when the mass ratio of the epoxy resin (B) is more than 50 relative to 100 of the total of the above solvent-soluble polyamide resin (A) and the epoxy resin (B), adhesiveness to an insulating film such as a polyimide film and a metal such as copper foil may decrease.

(C) Imidazole Compound Having Alkoxysilyl Group

The imidazole compound (C) having an alkoxysilyl group used in the present invention is a curing agent for the epoxy resin (B), and specific examples thereof include a compound represented by the following general formula (1) or an acid adduct thereof.

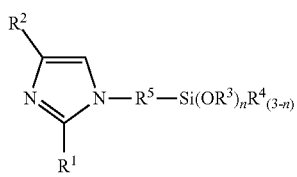

wherein $R^1$ and $R^2$ are each independently one selected from the group consisting of a hydrogen atom, a saturated hydrocarbon group, an unsaturated hydrocarbon group, and an aryl group, and these groups may have a substituent; $R^3$ and $R^4$ are each independently a hydrogen atom or an alkyl group, at least one of $R^3$ is an alkyl group, and the alkyl group may have a substituent; n is 1 to 3; and $R^5$ represents an alkylene chain or an alkylene chain partially substituted by a formula (2) to (5).

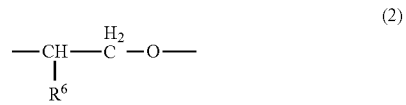

wherein $R^6$ represents a hydrogen atom or a hydroxyl group,

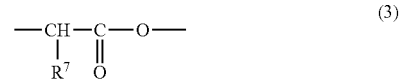

wherein $R^7$ represents a hydrogen atom, an alkyl group, or an aryl group,

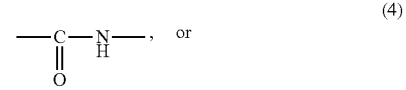

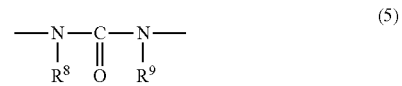

wherein $R^8$ and $R^9$ are each independently one selected from a group consisting of a hydrogen atom, an alkyl group, and an aryl group, and these groups may have a substituent.

The imidazole compound is generally used as a curing agent for the epoxy resin. When the above imidazole compound having an alkoxysilyl group is used in combination of the component (A) and the component (B) of the present invention, adhesiveness to gold-plated copper foil improves specifically. It is presumed that this is because the alkoxysilyl group and the imidazole structure exhibit high affinity for both the gold interface and the polyamide resin, and therefore due to their interaction, the adhesiveness improves. Further, it is presumed that the imidazole structure can also react with the epoxy, and therefore this adhesiveness-improving action can be maintained even in the reflow step.

The imidazole compound having an alkoxysilyl group represented by the above general formula (1) is a compound having both an imidazole group as a first functional group and an alkoxysilyl group as a second functional group in one molecule. The imidazole ring may have a substituent such as a saturated hydrocarbon group or an unsaturated hydrocarbon group.

In the general formula (1), when $R^1$, $R^2$, $R^3$, and $R^4$ are alkyl groups, their preferred number of carbon atoms is 1 to 3.

Examples of the compound from which the imidazole ring constituting the imidazole compound having an alkoxysilyl group is derived include imidazole, 2-alkylimidazoles, 2,4-dialkylimidazoles, and 4-vinylimidazole.

The alkoxysilyl group and the imidazole ring are bonded to each other via an alkylene chain or an alkylene chain partially substituted by a formula (2) to (5).

In the general formula (1), the number of carbon atoms of the alkylene chain of Rb is preferably 1 to 10, and more preferably 3 to 7. In the general formulas (6) and (7), $R^{5'}$ is an alkylene chain, preferably an alkylene chain having 1 to 10 carbon atoms, and more preferably an alkylene chain having 3 to 7 carbon atoms.

Examples of the imidazole compound having an alkoxysilyl group include compounds represented by the general formula (1) which are obtained by the reaction of the above imidazole compound with a 3-glycidoxyalkylsilane compound or the like, and salts thereof. The imidazole compound having an alkoxysilyl group may be a silanol compound produced by hydrolysis of the alkoxysilyl group of the aforementioned compound, or a polyorganosiloxane compound produced by a dehydration condensation reaction of the silanol compound, or may be a mixture thereof.

Examples of the acid added to the compound represented by the general formula (1) include acetic acid, lactic acid, salicylic acid, benzoic acid, adipic acid, phthalic acid, citric acid, tartaric acid, maleic acid, trimellitic acid, phosphoric acid, and isocyanuric acid. These can be used singly, or in combination of two or more thereof.

Specific examples of the imidazole compound (C) having an alkoxysilyl group include 1-(2-hydroxy-3-trimethoxysilylpropoxypropyl)-imidazole, 1-(2-hydroxy-3-triethoxysilylpropoxypropyl)-imidazole, 1-(2-hydroxy-3-tripropoxysilylpropoxypropyl)-imidazole, 1-(2-hydroxy-3-tributoxysilylpropoxypropyl)-imidazole, 1-(2-hydroxy-3-triethoxysilylpropoxypropyl)-2-methylimidazole, 1-(2-hydroxy-3-triethoxysilylpropoxypropyl)-4-methylimidazole; 1-(3-oxo-4-trimethoxysilylpropoxypropyl)-imidazole, and 1-(3-trimethoxysilylpropylamino)-imidazole.

Among the imidazole compounds (C) having an alkoxysilyl group, the compound represented by the chemical formula (6) or (7) is preferred since it has good heat resistance and also good solvent-solubility, and the acid adduct of the compound represented by the formula (6) is more preferred.

The compound represented by the chemical formula (6) can be obtained, for example, by reacting an imidazole compound such as imidazole, a 2-alkylimidazole, a 2,4-dialkylimidazole, or 4-vinylimidazole with a 3-glycidoxypropylsilane compound such as a 3-glycidoxypropyltrialkoxysilane, a 3-glycidoxypropyldialkoxyalkylsilane, or a 3-glycidoxypropylalkoxydialkylsilane. Among these, the reaction product of imidazole and 3-glycidoxypropyltrimethoxysilane is particularly preferred.

The compound represented by the chemical formula (7) can be obtained, for example, by reacting an imidazole compound with 3-methacryloyloxypropyltrimethoxysilane or the like.

The content of the imidazole compound (C) having an alkoxysilyl group represented by the above general formula (1) is 0.3 to 5 parts by mass with respect to 100 parts by mass of the total of the above polyamide resin (A) and the epoxy resin (B). In this range, adhesiveness to gold-plated copper foil and reflow resistance are good. The content is more preferably 0.5 to 3.0 parts by mass. When the content is less than 0.3 parts by mass, the adhesiveness of the adhesive composition of the present invention to gold-plated copper foil and the reflow resistance of the adhesive composition of the present invention decrease. On the other hand, when the content is more than 5 parts by mass, storage stability of the adhesive composition may worsen extremely.

When the adhesive composition of the present invention comprises a phenoxy resin (E) described later, the content is preferably 0.3 to 5 parts by mass with respect to 100 parts by mass of the total of the polyamide resin (A), the epoxy resin (B), and the phenoxy resin (E).

(D) Inorganic Filler

Specific examples of the inorganic filler include calcium carbonate, aluminum oxide, magnesium oxide, aluminum nitride, boron nitride, silicon nitride, titanium oxide, zinc oxide, talc, calcium carbonate, carbon black, silica, copper powder, aluminum powder, and silver powder. The inorganic filler has an effect of improving the heat resistance of the adhesive composition of the present invention.

Further, by using a filler having electrical conductivity, such as carbon black or metal powder, as the inorganic filler, electrical conductivity can be imparted to the adhesive layer. By using a filler having relatively high thermal conductivity, such as aluminum oxide, magnesium oxide, or aluminum nitride, thermal conductivity of the adhesive layer can be improved.

The content of the inorganic filler (D) is preferably 10 to 250 parts by mass with respect to 100 parts by mass of the total of the solvent-soluble polyamide resin (A) that is solid at 25° C. and the epoxy resin (B), because the heat resistance of the adhesive is improved within this range. The content is more preferably 50 to 250 parts by mass, further preferably 100 to 200 parts by mass. When the adhesive composition of the present invention comprises the phenoxy resin (E) described later, the content is preferably 10 to 250 parts by mass with respect to 100 parts by mass of the total of the polyamide resin (A), the epoxy resin (B), and the phenoxy resin (E).

When the content is less than 10 parts by mass, heat resistance of the adhesive composition of the present invention may not be obtained sufficiently. On the other hand, when the content is more than 250 parts by mass, adhesiveness to gold plating may decrease.

(E) Phenoxy Resin

As a resin component of the adhesive composition of the present invention, the phenoxy resin (E) can be blended in addition to the polyamide resin (A) and epoxy resin (B) mentioned above. The phenoxy resin (E) has an effect of improving initial adhesiveness and heat resistance of the adhesive. Examples of the phenoxy resin (E) include bisphenol A type phenoxy resins, bisphenol F type phenoxy resins, bisphenol S type phenoxy resins, and phosphorus-containing phenoxy resins. The terminal structure of the above phenoxy resin is not particularly limited, and a phenoxy resin having a hydroxyl group or a glycidyl group at a terminal can be used. The molecular weight thereof is not specifically limited, but the mass average molecular weight (Mw) is preferably in the range of 10000 to 100000 since good adhesiveness to adherends and excellent heat resistance result in this range, and is more preferably 20000 to 80000, and further preferably 30000 to 60000.

When the content of the phenoxy resin (E) is too small in the adhesive composition of the present invention, glass transition temperature of the cured product of the adhesive lowers, and heat resistance may be insufficient. On the other hand, the content is too large, adhesiveness may decrease. When the content of the phenoxy resin (E) is 10 to 200 parts by mass with respect to 100 parts by mass of the total of the polyamide resin (A) and the epoxy resin (B), heat resistance and adhesive force of the cured product of the adhesive can both be satisfied. The content is more preferably 15 to 180 parts by mass, further preferably 20 to 150 parts by mass.

In addition to the above components (A) to (E), a thermoplastic resin other than the component (A), a curing agent other than the component (C), a flame retardant, a coupling agent, an anti-thermal aging agent, a leveling agent, an antifoaming agent, or the like can be appropriately blended in the adhesive composition of the present invention to the extent that the functions of the adhesive composition are not influenced.

Examples of the thermoplastic resin other than the component (A) include resins such as polyester resins, polycarbonate resins, polyphenylene oxide resins, polyurethane resins, polyacetal resins, polyethylene resins, polypropylene resins, and polyvinyl resins.

As the above curing agent other than the component (C), generally used epoxy resin curing agents can be used. Examples thereof include amine curing agents such as aliphatic diamines, aliphatic polyamines, cycloaliphatic diamines, and aromatic diamines; polyamidoamine curing agents; acid curing agents such as aliphatic polycarboxylic acids, alicyclic polycarboxylic acids, aromatic polycarboxylic acids, and acid anhydrides thereof; basic curing agents having active hydrogen such as dicyandiamide and organic acid dihydrazides; tertiary amine curing agents, tertiary amine salt curing agents, imidazole curing agents other than the component (C), polymercaptan curing agents, novolac resin curing agents, urea resin curing agents, and melamine resin curing agents. One or two or more of these epoxy resin curing agents can be selected and used.

Specific examples of the aliphatic diamine curing agents include ethylenediamine, 1,3-diaminopropane, 1,4-diaminobutane, hexamethylenediamine, polymethylenediamine, polyether diamines, 2,5-dimethylhexamethylenediamine, and trimethylhexamethylenediamine.

Specific examples of the aliphatic polyamine curing agents include diethylenetriamine, iminobis(hexamethylene)triamine, trihexatetramine, tetraethylenepentamine, aminoethylethanolamine, tri(methylamino)hexane, dimethylaminopropylamine, diethylaminopropylamine, and methyliminobispropylamine.

Specific examples of the cycloaliphatic diamine curing agents include menthenediamine, isophoronediamine, bis(4-amino-3-methyldicyclohexyl)methane, diaminodicyclohexylmethane, bis(aminomethyl)cyclohexane, N-ethylaminopiperazine, 3,9-bis(3-aminopropyl)2,4,8,10-tetraoxaspiro(5,5)undecane, and hydrogenated products of meta-xylylenediamine.

Specific examples of the aromatic diamine curing agents include meta-phenylenediamine, diaminodiphenylmethane, diaminodiphenyl sulfone, diaminodiethyldiphenylmethane, and meta-xylylenediamine.

Specific examples of the aliphatic polycarboxylic acid curing agents and their acid anhydride curing agents include succinic acid, adipic acid, dodecenylsuccinic anhydride, polyadipic anhydride, polyazelaic anhydride, and polysebacic anhydride.

Specific examples of the alicyclic polycarboxylic acid curing agents and their acid anhydride curing agents include methyltetrahydrophthalic acid, methylhexahydrophthalic acid, methylhimic acid, hexahydrophthalic acid, tetrahydrophthalic acid, trialkyltetrahydrophthalic acids, methylcyclodicarboxylic acid, and acid anhydrides thereof.

Specific examples of the aromatic polycarboxylic acid curing agents and their acid anhydride curing agents include phthalic acid, trimellitic acid, pyromellitic acid, benzophenonetetracarboxylic acid, ethylene glycol glycol bistrimellitic acid, glycerol tristrimellitic acid, and acid anhydrides thereof.

Specific examples of the tertiary amine curing agents include benzyldimethylamine, 2-(dimethylaminomethyl) phenol, 2,4,6-tris(dimethylaminomethyl)phenol, tetramethylguanidine, triethanolamine, N,N'-dimethylpiperazine, triethylenediamine, and 1,8-diazabicyclo(5,4,0)undecene.

Specific examples of the tertiary amine salt curing agents include formate, octylate, p-toluenesulfonate, o-phthalate, phenol salts, and phenol novolac resin salts of 1,8-diazabicyclo(5,4,0)undecene; and formate, octylate, p-toluenesulfonate, o-phthalate, phenol salts, and phenol novolac resin salts of 1,5-diazabicyclo(4,3,0)nonene.

Specific examples of the imidazole curing agents other than the component (C) include 2-methylimidazole, 2-undecylimidazole, 2-heptadecylimidazole, 1,2-dimethylimidazole, 2-methyl-4-ethylimidazole, 2-phenylimidazole, 2-phenyl-4-methylimidazole, 1-benzyl-2-methylimidazole, 1-benzyl-2-phenylimidazole, a 2-phenylimidazole isocyanuric acid adduct, 2-phenyl-4,5-dihydroxymethylimidazole, and 2-phenyl-4-methyl-5-hydroxymethylimidazole.

Specific examples of the polymercaptan curing agents include mercapto epoxy resins and mercaptopropionates.

Specific examples of the novolac curing agents include phenol novolac curing agents and cresol novolac curing agents.

Specific examples of the melamine resin curing agents include methylated melamine resins, butylated melamine resins, and benzoguanamine resins.

Two or more types of the above curing agents can also be used together. The tertiary amine curing agents, the tertiary amine salt curing agents, and the imidazole curing agents can also be used in small amounts for the purpose of promoting the reaction of the epoxy resin with the curing agent.

The blending proportion of the epoxy resin curing agent other than the component (C) is preferably in the range of 0.2 to 2.5, more preferably in the range of 0.4 to 2.0 in terms of the functional group equivalent of the epoxy resin curing agent relative to one (1) epoxy equivalent of the epoxy resin. When the functional group equivalent of the epoxy resin curing agent is in the range of 0.2 to 2.5, the adhesive reaches a sufficiently cured state, and good adhesiveness and heat resistance are obtained.

Specific examples of the flame retardant include phosphate compounds and polyphosphate compounds such as melamine phosphate, melamine polyphosphate, guanidine phosphate, guanidine polyphosphate, ammonium phosphate, ammonium polyphosphate, amide ammonium phosphate, amide ammonium polyphosphate, carbamate phosphate, and carbamate polyphosphate; phosphinate compounds such as aluminum trisdiethylphosphinate, zinc bisdiethylphosphinate, and titanyl bisdiethylphosphinate; triazine compounds such as melamine, melam, and melamine cyanurate; nitrogen flame retardants such as cyanuric acid compounds, isocyanuric acid compounds, triazole compounds, tetrazole compounds, diazo compounds, and urea; silicon flame retardants such as silicone compounds and silane compounds; metal hydroxides such as aluminum hydroxide, magnesium hydroxide, zirconium hydroxide, barium hydroxide, and calcium hydroxide; and inorganic flame retardants such as tin oxide, zirconium oxide, molybdenum oxide, antimony trioxide, antimony pentoxide, zinc borate, and hydrated glass. Two or more types of these flame retardants can be used in combination.

Specific examples of the above coupling agent include silane coupling agents such as vinyltrimethoxysilane, 3-glycidoxypropyltrimethoxysilane, p-styryltrimethoxysilane, 3-methacryloxypropylmethyldimethoxysilane, 3-acryloxypropyltrimethoxysilane, N-2(aminoethyl)-3-aminopropylmethyldimethoxysilane, 3-ureidopropyltriethoxysilane, 3-mercaptopropylmethyldimethoxysilane, bis(triethoxysilylpropyl)tetrasulfide, and 3-isocyanatepropyltriethoxysilane, and titanate coupling agents; aluminate coupling agents, and zirconium coupling agents. These are used singly or in combination of two or more thereof.

Specific examples of the above anti-thermal aging agent include phenol antioxidants such as 2,6-di-t-butyl-4-methylphenol, n-octadecyl-3-(3',5'-di-t-butyl-4'-hydroxyphenyl) propionate, and tetrakis[methylene-3-(3,5-di-t-butyl-4-hydroxyphenyl)propionate]methane; sulfur antioxidants such as dilauryl-3,3'-thiodipropionate and dimyristyl-3,3'-dithiopropionate; and phosphorus antioxidants such as trisnonylphenyl phosphite and tris(2,4-di-t-butylphenyl)phosphite. These are used singly, or in combination of two or more thereof.

The adhesive composition of the present invention is obtained by stirring and mixing the components described above, and is usually used after dissolved in a solvent. As the solvent, a solvent that dissolves the above polyamide resin (A) can be used. Here, when the above polyamide resin (A) is an alcohol-soluble polyamide resin, a mixed solvent in which an alcohol solvent and one or two or more other solvents are used in combination is preferably used because other components are also easy to dissolve. For example, a mixed liquid of an alcohol solvent and a ketone solvent, or a mixed liquid of an alcohol solvent, an aromatic solvent, and a ketone solvent is used. In the case of the alcohol-soluble polyamide resin, the amount of the alcohol relative to the entire solvent used in the adhesive composition of the present invention is preferably set in the range of 20 to 80% by mass. When the amount of the alcohol is in the above range, all of the polyamide resin, the epoxy resin, and the phenoxy resin dissolve well therein.

In a case where the adhesive composition of the present invention is used after dissolved as described above, when the solid content of resin is too low, it may be difficult to form a coating having a desired thickness. On the other hand, when the solid content is too high, the viscosity of the solution is too high, and therefore uniform coating may be difficult. When the solid content of resin is set in the range of 3 to 80% by mass, the above problem of coatability is eliminated. The solid content of resin is more preferably in the range of 10 to 50% by mass.

<2. Coverlay Film>

A coverlay film can be provided by forming a layer of the adhesive composition of the present invention on one surface of an electrically insulating substrate film such as a polyimide film. Specifically, a coverlay film can be made by coating one surface of the electrically insulating substrate film with a solution of the adhesive composition of the present invention and drying it at a temperature of 40 to 250° C., preferably 70 to 170° C., for about 2 to 10 minutes. The above drying can be performed by passage through a furnace in which hot air drying, far infrared heating, high frequency induction heating, or the like is performed. The thickness of the above adhesive composition after drying is usually 5 to 45 µm, preferably 10 to 35 µm. A releasable film may be temporarily laminated on the adhesive-coated surface of the thus-obtained coverlay film for the purpose of storage and the like. As the releasable film, a known one is used including a polyethylene terephthalate film, a polyethylene film, a polypropylene film, silicone coated release paper, polyolefin resin-coated paper, a TPX film, and a fluororesin film.

<3. Flexible Copper Clad Laminate>

A flexible copper clad laminate can be provided by laminating a layer of the adhesive composition of the present invention between at least one surface of a polyimide film and copper foil. Specifically, a flexible copper clad laminate can be made by coating one surface of an electrically insulating substrate film such as a polyimide film with a solution of the above adhesive composition and drying it at a temperature of 40 to 250° C., preferably 70 to 170° C., for about 2 to 10 minutes followed by thermal lamination with copper foil at 80 to 150° C. This flexible copper clad laminate can be further after-cured (at 100 to 200° C., for 30 minutes to 4 hours) to cure the adhesive composition to obtain the final flexible copper clad laminate. The thickness of the above adhesive composition after drying is usually 5 to 45 µm, preferably 5 to 18 µm.

<4. Adhesive Sheet>

An adhesive sheet can be provided by forming a layer of the adhesive composition of the present invention on a surface of a releasable film. Specifically, a layer of the adhesive composition can be formed by coating a solution of the above adhesive composition on a releasable film and drying it at a temperature of 40 to 250° C., preferably 70 to 170° C., for about 2 to 10 minutes. The thickness of the above layer of the adhesive composition after drying is usually 5 to 35 µm, preferably 10 to 25 µm. A releasable film may be temporarily laminated on the adhesive-coated surface of the thus-obtained adhesive sheet for the purpose of storage and the like. As the releasable film, a known one is used including a polyethylene terephthalate film, a polyethylene film, a polypropylene film, silicone coated release paper, polyolefin resin-coated paper, a TPX film, and a fluororesin film.

The above adhesive sheet is used, for example, in a case where flexible printed wiring boards are bonded to each other to produce a multilayer flexible printed wiring board, a case where a flexible printed wiring board and a reinforcing plate are bonded to each other, a case where a printed wiring board and various mounting components are glued to each other, and in addition a case where a substrate having a gold plating portion and another component are glued to each other.

EXAMPLES

The present invention will be more specifically described based on Examples and Comparative Examples, but the present invention is not limited to these. In the following, parts and % are based on mass unless otherwise noted.

1. Preparation of Evaluation Sample

In Examples 1 to 8 and Comparative Examples 1 to 5, the components shown in Table 1 except the component D (inorganic filler component) were added in the compositional proportions shown in the same table to a solvent (toluene/methanol/MEK mass ratio=1/1/1), and stirred and dissolved to prepare an adhesive composition solution (to which the component D had not been added).

(1) Gold-Plated Copper Foil-Bonded Sample (to which the Component D had not been Added)

A polyimide film having a thickness of 25 µm was provided, and its surface was roll-coated with the above adhesive composition solution so as to have a thickness of 25 µm after drying, and dried at 140° C. for 2 minutes to make a coverlay film. Then, gold-plated copper foil having a thickness of 35 µm was provided, and this was layered so as to be in contact with the surface of the adhesive layer of the coverlay film, and lamination was performed under the conditions of 150° C., 0.3 MPa, and 1 m/min. This laminate (polyimide film/adhesive layer/copper foil) was heat-pressure-bonded under the conditions of 150° C. and 3 MPa for 5 minutes and then further after-cured in an oven at 160° C. for 2 hours to make an adhesion test piece A of a flexible copper clad laminate.

(2) Gold-Plated Copper Foil-Bonded Sample (to which the Component D was Added)

The component D (inorganic filler component) was added in a proportion shown in Table 1 to the above adhesive composition solution (to which the component D had not been added), and stirred and mixed.

A surface of a polyimide film having a thickness of 25 μm was roll-coated with this adhesive composition solution to which the D component was added, so as to have a thickness of 50 μm after drying, and dried at 140° C. for 2 minutes to make a coverlay film. Then, gold-plated copper foil having the same thickness (35 μm) as above was provided, and this was layered so as to be in contact with the surface of the adhesive layer of the coverlay film, and lamination was performed under the conditions of 150° C., 0.3 MPa, and 1 m/min. This laminate (polyimide film/adhesive layer/copper foil) was heat-pressure-bonded under the conditions of 150° C. and 3 MPa for 5 minutes and then further after-cured in an oven at 160° C. for 2 hours to make an adhesion test piece B of a flexible copper clad laminate.

(3) Adhesive Sheet Samples

In Example 9, Example 10, Comparative Example 6, and Comparative Example 7, a surface of a release-treated PET film having a thickness of 25 μm was roll-coated with an adhesive composition solution (to which the component D had not been added) made in the same manner as above, so as to have a thickness of 25 μm after drying, and dried at 140° C. for 2 minutes to make an adhesive sheet A.

In Example 9, Example 10, Comparative Example 6, and Comparative Example 7, a surface of a release-treated PET film having a thickness of 25 μm was roll-coated with the above adhesive composition solution (to which the component D was added) so as to have a thickness of 50 μm after drying, and dried at 140° C. for 2 minutes to make an adhesive sheet B.

(4) Gold-Plated Copper Foil-Bonded Samples of Adhesive Sheets

A polyimide film having a thickness of 25 μm was provided, and this was laminated with the adhesive sheet A or the adhesive sheet B under the conditions of 120° C., 0.3 MPa, and 1 m/min, and then the PET film was peeled to make a coverlay film in which the adhesive was transferred to the polyimide film. Then, gold-plated copper foil having the same thickness (35 Jpn) as above was provided, and this was layered so as to be in contact with the surface of the adhesive layer of the coverlay film, and lamination was performed under the conditions of 150° C., 0.3 MPa, and 1 m/min. This laminate (polyimide film/adhesive layer/copper foil) was heat-pressure-bonded under the conditions of 150° C. and 3 MPa for 5 minutes and then further after-cured in an oven at 160° C. for 2 hours to make an adhesion test piece C or D of a flexible copper clad laminate.

2. Evaluation (1) Peel Strength

A 1800 peel adhesion strength (N/cm) was measured when the polyimide film of each of the adhesion test piece A, adhesion test piece B, adhesion test piece C, and adhesion test piece D was peeled from the gold-plated copper foil at 23° C. in accordance with JIS C 6481. Upon measurement, the width of the adhesion test piece was 10 mm, and the tensile speed was 50 mm/min.

(2) Soldering Heat Resistance

Test was performed under the following conditions in accordance with JIS C 6481.

Each of the above adhesion test piece A, adhesion test piece B, adhesion test piece C, and adhesion test piece D was floated on a soldering bath at 260° C. for 60 seconds with the polyimide film surface up, and the presence or absence of appearance abnormality such as blistering and peeling of the adhesive layer was visually evaluated. As a result, the case in which appearance abnormality such as blistering and peeling was not confirmed was shown as ○, and the case in which appearance abnormality such as blistering and peeling was confirmed was shown as x. Further, the test piece recovered from the above soldering bath was measured for the 1800 peel adhesion strength (N/cm) when the polyimide film was peeled from the gold-plated copper foil at 23° C. in accordance with JIS C 6481. Upon measurement, the width of the adhesion test piece was 10 mm, and the tensile speed was 50 mm/min.

(3) Storage Stability (Liquid)

The above adhesive composition solution (to which the component D had not been added) was placed in a 500 ml glass bottle and hermetically sealed. This was stored in an environment at 23° C., and the viscosity change between the initial stage and 30 days later was measured. The measurement was performed in accordance with JIS C 6833 using a B type viscometer. The relative viscosity after 30 days with respect to 100 of the initial viscosity is indicated in Table 2.

(4) Storage Stability (Film)

Each of the above adhesive sheets A and B was stored in an environment at 23° C. for 30 days. Then, a polyimide film having a thickness of 25 μm was provided, and lamination was performed under the conditions of 120° C., 0.3 MPa, and 1 m/min. Then, it was visually evaluated whether the adhesive was transferred to the polyimide film when the PET film was peeled. As a result, the case where the PET peeled cleanly, but no lifting was observed at the interface between the adhesive and the polyimide film was indicated as ○, the case where lifting or partial peeling occurred at the interface between the adhesive and the polyimide film when the PET was peeled was shown as Δ, and the case where peeling occurred at a large portion of the interface between the adhesive and the polyimide film was shown as x.

3. Examples 1 to 10 and Comparative Examples 1 to 7

The formulations of the adhesive compositions are shown in Table 1, and the evaluation results of the Examples and the Comparative Examples are shown in Table 2. The abbreviations of the components in the table mean the following materials.

<Polyamide Resin (A)>

The polyamide resin a1 was synthesized as follows.

A flask equipped with a stirrer, a reflux dehydration apparatus, and a distillation tube was charged with 65 parts by mass of azelaic acid, 190 parts by mass of dodecanedioic acid, 100 parts by mass of piperazine, and 120 parts by mass of distilled water. The temperature was increased to 120° C. to distill water, and then the temperature was increased to 240° C. at a rate of 20° C./h, and the reaction was continued for 3 hours to obtain the polyamide resin a1. The amine value at that time was 4.5 mg KOH/g.

The polyamide resin a2 was synthesized as follows.

A flask equipped with a stirrer, a reflux dehydration apparatus, and a distillation tube was charged with 485 parts by mass of dimer acid, 100 parts by mass of hexamethylenediamine, and 120 parts by mass of distilled water. The temperature was increased to 120° C. to distill water, and then the temperature was increased to 240° C. at a rate of 20° C./h, and the reaction was continued for 3 hours to obtain the polyamide resin a2. The amine value at that time was 4.5 mg KOH/g.

<Epoxy Resin (B)>

Epoxy resin b1: trade name "Epotohto YDCN-701" manufactured by Nippon Steel Chemical Co., Ltd., a cresol novolac type polyfunctional epoxy resin Epoxy resin b2: trade name "EPICLON N-865" manufactured by DIC, a bisphenol A novolac type epoxy resin Epoxy resin b3: trade name "jER828" manufactured by Mitsubishi Chemical Corporation, a bisphenol A type epoxy resin <Imidazole Compound (C)>

Imidazole compound c1: 1-(2-hydroxy-3-trimethoxysilyl-propoxypropyl)-imidazole

Imidazole compound c2: an acetic acid adduct of the imidazole compound c1

<Inorganic Filler (D)>

Inorganic filler d1: trade name "FCC-115A", copper powder manufactured by Fukuda Metal Foil & Powder Co., Ltd.

<Other Additives>

Additive 1: trade name "KBM-402", 3-glycidoxypropyldimethoxysilane manufactured by Shin-Etsu Chemical Co., Ltd.

Additive 2: trade name "CUREZOL 2MZ-A", 2,4-diamino-6-[2'-methylimidazolyl-(1')]-ethyl-s-triazine manufactured by SHIKOKU CHEMICALS CORPORATION

TABLE 1

| | | | Examples | | | | | | | | | |
|---|---|---|---|---|---|---|---|---|---|---|---|---|
| | | | 1 | 2 | 3 | 4 | 5 | 6 | 7 | 8 | 9 | 10 |
| Composition <mass> | A | Polyamide resin a1 | 85 | 85 | 85 | 85 | 85 | 85 | 85 | | 85 | 85 |
| | | Polyamide resin a2 | | | | | | | | 85 | | |
| | B | Epoxy resin b1 | 15 | | | | | | 7.5 | | | |
| | | Epoxy resin b2 | | 15 | 15 | 15 | 15 | | 7.5 | 15 | 15 | 15 |
| | | Epoxy resin b3 | | | | | | 15 | | | | |
| | C | Imidazole compound c1 | 1 | 1 | 0.5 | 2 | | 1 | 1 | 1 | 1 | |
| | | Imidazole compound c2 | | | | | 1 | | | | | 1 |
| | Other additives | Additive 1 | | | | | | | | | | |
| | | Additive 2 | | | | | | | | | | |
| | Solvent | Toluene/ methanol/ MEK | 300 | 300 | 300 | 300 | 300 | 300 | 300 | 300 | 300 | 300 |
| | D | Inorganic filler d1 | 100 | 100 | 100 | 100 | 100 | 100 | 100 | 100 | 100 | 100 |
| Processed form | | | Liquid | Liquid | Liquid | Liquid | Liquid | Liquid | Liquid | Liquid | Sheet | Sheet |

| | | | Comparative Examples | | | | | | |
|---|---|---|---|---|---|---|---|---|---|
| | | | 1 | 2 | 3 | 4 | 5 | 6 | 7 |
| Composition <mass> | A | Polyamide resin a1 | 85 | 85 | 85 | 45 | 100 | 85 | 85 |
| | | Polyamide resin a2 | | | | | | | |
| | B | Epoxy resin b1 | 15 | 15 | | | | 15 | |
| | | Epoxy resin b2 | | | 15 | 55 | | | 15 |
| | | Epoxy resin b3 | | | | | | | |
| | C | Imidazole compound c1 | | | 10 | 1 | 1 | | 10 |
| | | Imidazole compound c2 | | | | | | | |
| | Other additives | Additive 1 | 1 | | | | | 1 | |
| | | Additive 2 | | 1 | | | | | |
| | Solvent | Toluene/ methanol/ MEK | 300 | 300 | 300 | 300 | 300 | 300 | 300 |
| | D | Inorganic filler d1 | 100 | 100 | 100 | 100 | 100 | 100 | 100 |
| Processed form | | | Liquid | Liquid | Liquid | Liquid | Liquid | Sheet | Sheet |

TABLE 2

|  |  |  | Examples |  |  |  |  |  |  |  |  |  | Comparative Examples |  |  |  |  |  |  |
|---|---|---|---|---|---|---|---|---|---|---|---|---|---|---|---|---|---|---|---|
|  |  |  | 1 | 2 | 3 | 4 | 5 | 6 | 7 | 8 | 9 | 10 | 1 | 2 | 3 | 4 | 5 | 6 | 7 |
| Adhesiveness to gold-plated copper foil (D component had not been added) | Initial | Peel strength (N/cm) | 18 | 21 | 18 | 20 | 17 | 17 | 20 | 11 | 18 | 17 | 9 | 15 | 15 | 4 | 8 | 8 | 13 |
|  | Soldering heat resistance | Peel strength (N/cm) | 16 | 20 | 19 | 21 | 18 | 10 | 19 | 7 | 19 | 18 | 7 | 18 | 11 | 1 | 3 | 7 | 9 |
|  |  | Appearance | ○ | ○ | ○ | ○ | ○ | ○ | ○ | ○ | ○ | ○ | ○ | ○ | X | X | X | ○ | X |
| Adhesiveness to gold-plated copper foil (D component was added) | Initial | Peel strength (N/cm) | 7 | 11 | 10 | 11 | 12 | 11 | 10 | 9 | 11 | 10 | 5 | 10 | 9 | 3 | 6 | 4 | 8 |
|  | Soldering heat resistance | Peel strength (N/cm) | 15 | 20 | 15 | 20 | 19 | 5 | 19 | 5 | 19 | 18 | 3 | 7 | 3 | 1 | 2 | 3 | 3 |
|  |  | Appearance | ○ | ○ | ○ | ○ | ○ | ○ | ○ | ○ | ○ | ○ | X | X | X | X | X | X | X |
| Storage stability (liquid) | Relative viscosity |  | 190 | 280 | 220 | 310 | 200 | 180 | 240 | 180 | — | — | 160 | 200 | 840 | 140 | 110 | — | — |
| Storage stability (sheet) | Appearance |  | — | — | — | — | — | — | — | Δ | ○ | — | — | — | — | — | ○ | X |

From the results in the above Tables 1 and 2, it is seen that the adhesive compositions of Examples 1 to 8 containing an imidazole compound having an alkoxysilyl group were excellent in the adhesiveness to gold plating and the reflow resistance in both cases where the inorganic filler was not added and where the inorganic filler was added. It is particularly seen that the storage stability was also good in Example 5 in which an acid adduct of an imidazole compound having an alkoxysilyl group was contained. On the other hand, in Comparative Examples 1, 2, and 6, an additive different from the imidazole compound having an alkoxysilyl group according to the present invention was used, and therefore the adhesiveness to gold plating and the reflow resistance at the time of bonding gold-plated copper foil were poor, and this tendency was significant particularly when the inorganic filler was added. In Comparative Examples 3 and 7, the addition amount of the imidazole compound having an alkoxysilyl group added was too large, and therefore desired effects were not exerted, and moreover the storage stability was poor.

On the other hand, in Comparative Example 4 in which the amount of the epoxy resin (B) was more than the defined amount, the adhesiveness and the heat resistance both decreased significantly. In Comparative Example 5 in which the epoxy resin (B) was not blended, the heat resistance decreased significantly.

INDUSTRIAL APPLICABILITY

The adhesive composition of the present invention has good adhesiveness to gold-plated copper foil and is also excellent in soldering heat resistance, and therefore can be used for a coverlay film, a flexible copper clad laminate, a heat dissipating adhesive, an electrically conductive adhesive, an adhesive sheet, and the like.

The invention claimed is:

1. An adhesive composition comprising a solvent-soluble polyamide resin (A) that is solid at 25° C., an epoxy resin (B), an imidazole compound (C) having an alkoxysilyl group, and an inorganic filler (D) having electrical conductivity, wherein the adhesive composition has a mass ratio (A)/(B) of the component (A) to the component (B) of 99/1 to 50/50, wherein the epoxy resin (B) is a bisphenol A novolac type epoxy resin, wherein the adhesive composition contains the component (C) in an amount of 0.3 to 5 parts by mass with respect to 100 parts by mass of the total of the component (A) and the component (B), and wherein the adhesive composition contains the inorganic filler (D) in an amount of 10 to 250 parts by mass with respect to 100 parts by mass of the total of the polyamide resin (A) and the epoxy resin (B).

2. The adhesive composition according to claim 1, wherein the imidazole compound (C) having an alkoxysilyl group is a compound represented by the following general formula (1) or an acid adduct thereof,

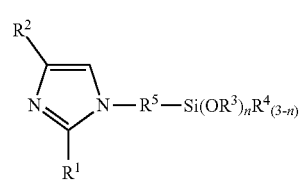

(1)

wherein $R^1$ and $R^2$ are each independently one selected from a group consisting of a hydrogen atom, a saturated hydrocarbon group, an unsaturated hydrocarbon group, and an aryl group, and these groups may have a substituent; $R^3$ and $R^4$ are each independently a hydrogen atom or an alkyl group, at least one of $R^3$ is an alkyl group, and the alkyl group may have a substituent; n is 1 to 3; and $R^5$ represents an alkylene chain or an alkylene chain partially substituted by a formula (2) to (5),

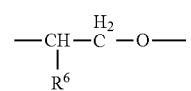

(2)

wherein $R^6$ represents a hydrogen atom or a hydroxyl group,

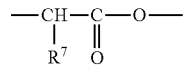
(3)

wherein $R^7$ represents a hydrogen atom, an alkyl group, or an aryl group,

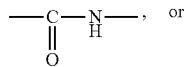
(4)

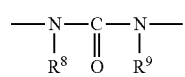
(5)

wherein $R^8$ and $R^9$ are each independently one selected from a group consisting of a hydrogen atom, an alkyl group, and an aryl group, and these groups may have a substituent.

3. The adhesive composition according to claim 2, wherein the imidazole compound (C) having an alkoxysilyl group is a compound represented by the following general formula (6) or (7) or an acid adduct thereof,

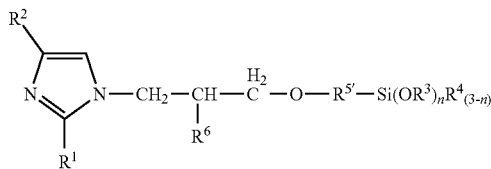
(6)

wherein R', $R^2$, $R^3$, $R^4$, and n are the same as in the formula (1), $R^6$ is the same as in the formula (2), and $R^{5'}$ is an alkylene chain,

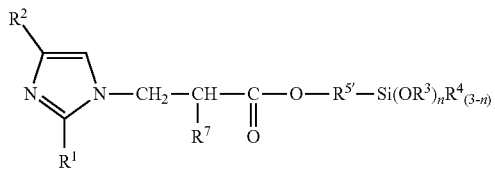
(7)

wherein R', $R^2$, $R^3$, $R^4$, and n are the same as in the formula (1), $R^7$ is the same as in the formula (3), and $R^{5'}$ is an alkylene chain.

4. The adhesive composition according to claim 2, wherein the imidazole compound (C) having an alkoxysilyl group is a compound represented by the following general formula (6) or an acid adduct thereof,

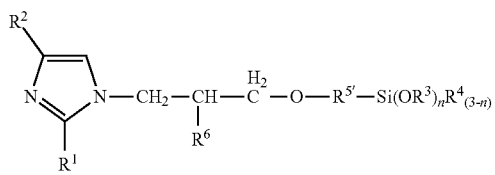
(6)

wherein R', $R^2$, $R^3$, $R^4$, and n are the same as in the formula (1), $R^6$ is the same as in the formula (2), and $R^{5'}$ is an alkylene chain.

5. The adhesive composition according to claim 2, wherein the imidazole compound (C) having an alkoxysilyl group is a compound represented by the following general formula (7) or an acid adduct thereof,

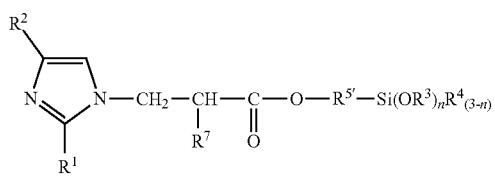
(7)

wherein R', $R^2$, $R^3$, $R^4$, and n are the same as in the formula (1), $R^7$ is the same as in the formula (3), and $R^{5'}$ is an alkylene chain.

6. The adhesive composition according to claim 2, wherein the imidazole compound (C) is the acid adduct.

7. The adhesive composition according to claim 1, wherein the epoxy resin (B) is an epoxy resin having three or more epoxy groups in one molecule.

8. The adhesive composition according to claim 1, wherein the polyamide resin (A) is a copolymer of an aliphatic dibasic acid and an alicyclic diamine.

9. The adhesive composition according to claim 1, wherein the polyamide resin (A) has an amine value of 1 to 6 mg KOH/g.

10. The adhesive composition according to claim 1, wherein the inorganic filler (D) is selected from the group consisting of carbon black, copper, aluminum, silver and a combination thereof.

11. A coverlay film which comprises a polyimide film and a layer of the adhesive composition according to claim 1 formed on one surface of the polyimide film.

12. A flexible copper clad laminate which comprises a polyimide film and copper foil, wherein the adhesive composition according to claim 1 is laminated between at least one surface of the polyimide film and the copper foil.

13. An adhesive sheet which comprises a releasable film and a layer of the adhesive composition according to claim 1 formed on a surface of the releasable film.

* * * * *